US 9,574,685 B2

(12) United States Patent
Mykleby

(10) Patent No.: US 9,574,685 B2
(45) Date of Patent: Feb. 21, 2017

(54) COOLING SYSTEM FOR MAGNETIC RESONANCE IMAGING DEVICE HAVING REDUCED NOISE AND VIBRATION

(75) Inventor: Sean D. Mykleby, Arlington Heights, IL (US)

(73) Assignee: Pittsburgh Universal, LLC, Sewickley, PA (US)

( * ) Notice: Subject to any disclaimer, the term of this patent is extended or adjusted under 35 U.S.C. 154(b) by 1241 days.

(21) Appl. No.: 13/563,095

(22) Filed: Jul. 31, 2012

(65) Prior Publication Data
US 2013/0335084 A1 Dec. 19, 2013

Related U.S. Application Data

(60) Provisional application No. 61/661,474, filed on Jun. 19, 2012.

(51) Int. Cl.
F16L 9/06 (2006.01)
G01R 33/38 (2006.01)
F16L 59/14 (2006.01)
G01R 33/3815 (2006.01)

(52) U.S. Cl.
CPC ............ F16L 9/06 (2013.01); F16L 59/143 (2013.01); G01R 33/3804 (2013.01); G01R 33/3815 (2013.01)

(58) Field of Classification Search
CPC .... G01R 33/3804; G01R 33/3815; F16L 9/06; F16L 59/143
See application file for complete search history.

(56) References Cited

U.S. PATENT DOCUMENTS

| 4,488,406 | A |   | 12/1984 | Eckels |                   |
|-----------|---|---|---------|--------|-------------------|
| 4,492,088 | A |   | 1/1985  | Ibrahim et al. |         |
| 4,492,089 | A |   | 1/1985  | Rohner et al. |          |
| 4,510,771 | A | * | 4/1985  | Matsuda | ........ F17C 3/085 |
|           |   |   |         |        | 505/892           |
| 4,796,433 | A | * | 1/1989  | Bartlett | ........ H01F 6/04 |
|           |   |   |         |        | 62/47.1           |
| 4,984,605 | A |   | 1/1991  | Schippi |                  |
| 5,361,588 | A |   | 11/1994 | Asami et al. |           |
| 5,381,666 | A | * | 1/1995  | Saho | ............ F25B 9/10 |
|           |   |   |         |        | 62/298            |
| 5,489,848 | A | * | 2/1996  | Furukawa | ....... G01R 33/3815 |
|           |   |   |         |        | 324/318           |
| 5,586,437 | A | * | 12/1996 | Blecher | ........ F25B 9/00 |
|           |   |   |         |        | 62/47.1           |
| 5,744,959 | A | * | 4/1998  | Jeker | ........... H01F 6/04 |
|           |   |   |         |        | 324/319           |

(Continued)

OTHER PUBLICATIONS

Omegaflex, Inc., General Product & Engineering Design Catalog, Feb. 2007, pp. 1-9, Exton, PA.

Primary Examiner — Dixomara Vargas
(74) Attorney, Agent, or Firm — Metz Lewis Brodman Must O'Keefe LLC

(57) ABSTRACT

A conduit for the transfer of a cooling medium is provided that may include a tube that has a length and a through aperture that extends through the entire length. The tube may have an inner surface that defines a helical channel that may be continuous along a length of the tube such that the helical channel is continuous along a plurality of turns of the helical channel along the inner surface. The conduit may be incorporated into a cooling system of a magnetic resonance imaging device.

26 Claims, 7 Drawing Sheets

(56) References Cited

U.S. PATENT DOCUMENTS

| | | | | |
|---|---|---|---|---|
| 5,889,456 | A * | 3/1999 | Triebe | G01R 33/3403 324/318 |
| 5,913,888 | A * | 6/1999 | Steinmeyer | F25B 9/145 62/259.2 |
| 5,966,944 | A * | 10/1999 | Inoue | F25B 9/145 62/51.1 |
| 6,094,922 | A | 8/2000 | Ziegler | |
| 7,015,692 | B2 * | 3/2006 | Clarke | G01R 33/3403 324/300 |
| 7,030,613 | B2 * | 4/2006 | Morita | G01R 33/31 324/318 |
| 7,112,963 | B2 * | 9/2006 | Hasegawa | G01R 33/31 324/307 |
| 7,126,335 | B2 * | 10/2006 | Morita | G01R 33/31 324/318 |
| 7,141,979 | B2 * | 11/2006 | Marek | G01R 33/34076 324/322 |
| 7,235,975 | B2 * | 6/2007 | Kasten | G01R 33/3815 324/318 |
| 7,245,126 | B1 * | 7/2007 | Hasegawa | G01R 33/31 324/315 |
| 7,301,343 | B1 * | 11/2007 | Sellers | G01R 33/3856 324/318 |
| 7,318,318 | B2 * | 1/2008 | Roth | F25B 9/02 62/51.1 |
| 7,404,295 | B2 * | 7/2008 | Li | F25B 9/145 165/4 |
| 7,430,872 | B2 * | 10/2008 | Strobel | F25D 19/006 62/259.2 |
| 7,501,822 | B2 * | 3/2009 | Sacher | G01R 33/34015 324/318 |
| 7,538,649 | B2 * | 5/2009 | Nakayama | G01R 33/3815 335/216 |
| 7,570,053 | B2 * | 8/2009 | Hasegawa | G01R 33/31 324/307 |
| 7,719,160 | B2 * | 5/2010 | Koizumi | H02K 5/128 310/114 |
| 7,728,592 | B2 * | 6/2010 | Ma | G01R 33/307 324/318 |
| 7,772,842 | B2 * | 8/2010 | Gao | G01R 33/307 324/307 |
| 8,053,946 | B2 * | 11/2011 | Koizumi | H02K 5/128 310/266 |
| 8,072,219 | B2 * | 12/2011 | Saito | F25B 9/145 324/318 |
| 8,148,987 | B2 * | 4/2012 | Kruip | G01R 33/3854 324/318 |
| 8,188,741 | B2 * | 5/2012 | Sakakura | H01F 6/04 324/318 |
| 8,516,833 | B2 * | 8/2013 | Xu | F25B 9/14 62/6 |
| 2008/0134692 | A1 | 6/2008 | Crowley | |

* cited by examiner

US 9,574,685 B2

COOLING SYSTEM FOR MAGNETIC RESONANCE IMAGING DEVICE HAVING REDUCED NOISE AND VIBRATION

CROSS REFERENCE TO RELATED APPLICATION

This application claims the benefit of U.S. Application Ser. No. 61/661,474 filed on Jun. 19, 2012 and entitled, "Cooling System for Magnetic Resonance Imaging Device Having Reduced Noise and Vibration." U.S. Application Ser. No. 61/661,474 is incorporated by reference herein in its entirety for all purposes.

FIELD OF THE INVENTION

The present invention relates generally to a system for cooling a magnetic resonance imaging device. More specifically, the present application involves the incorporation of a particular helically wound gas transfer conduit as part of the cooling system which permits flow of gas cooling medium with reduced noise and vibration.

BACKGROUND

Magnetic resonance imaging (MRI) is a medical imaging technique used in radiology that allows a health care provider to visualize internal structures of the body. An MRI device closely surrounds the patient and includes a superconducting magnet that requires a cooling system. In this regard, a compressor transfers a cooling medium, such as helium or nitrogen, through a supply conduit to a heat exchanger that transfers heat from the magnet to the cooling medium. The cooling medium is then transferred through a return conduit back to the compressor.

The MRI equipment and cooling system generates noise and vibration. The flow of cooling medium through the heat exchanger creates noise and vibration that can be increased by the conduits connected to the heat exchanger that function as an amplifier. Still further, the flow of cooling medium through the conduits themselves generates noise and vibration should the inner surfaces of the conduits have irregularities or otherwise be unsmooth.

One example of a cold head that may be incorporated into an MRI is disclosed with reference to U.S. Pat. No. 5,361,588 to Asami, the contents of which are incorporated by reference herein in their entirety for all purposes. Noise and vibration from the heat exchanger and/or conduits may disturb the patient and make him or her apprehensive, especially considering the fact that the patient is in close proximity to the MRI equipment and potentially already on edge. If the patient is uncomfortable or apprehensive during an MRI procedure he or she may move and ruin the measured reading which requires the patient to remain still. Therefore, aside from being only an annoyance, noise and vibration generated in the cooling of MRI equipment functions to increase the cost of operating the equipment and the time in obtaining results.

In order to reduce noise and vibration associated with MRI cooling, United States Patent Publication No. 2008/0134692 to Crowley discloses a conduit for the transfer of cooling medium includes an inner conduit surrounded by and coaxial with an outer conduit. Input cooling medium flows through the inner conduit and output, warmed cooling medium flows back through the outer conduit. The opposite direction of flow of this gas within the conduits is stated as having a canceling effect to reduce noise in the cooling process. United States Patent Publication No. 2008/0134692 is incorporated by reference herein in its entirety for all purposes.

Another design implemented for the transfer of cooling medium in cryopump-type systems disclosed in U.S. Pat. No. 6,094,922 to Ziegler employs a smooth bore input tube that is separated from a smooth bore output tube. The two tubes are surrounded by an umbilical cord and a vacuum is created in the space within the umbilical cord. Although capable of managing heat transfer in the system, such a design does not reduce noise generated by the cooling system. This design involves the transfer of a liquid cooling medium and not a gas cooling medium. U.S. Pat. No. 6,094,922 is incorporated by reference herein in its entirety for all purposes. Although various designs of cooling systems exist, there remains room for variation and improvement in the art.

SUMMARY OF THE INVENTION

In accordance with one aspect of the design, a cooling system for a magnetic resonance imaging device is provided that includes a compressor that is in fluid communication with a supply conduit. A cooling medium is transferred from the compressor through the supply conduit and includes a tube that has a through aperture and an inner surface that defines a helical channel. The helical channel is continuous from a first turn of the helical channel to a second turn of the helical channel. A heat exchanger is present and receives the cooling medium from the supply conduit and heats the cooling medium. A return conduit is in fluid communication with the compressor, and the cooling medium is transferred through the return conduit back to the compressor.

Another aspect of the present design resides in a conduit for the transfer of a cooling medium that has a tube with a length and a through aperture that extends through the entire length. The tube has an inner surface that defines a channel. The channel has a plurality of turns that number at least 120 turns per foot of the length of the tube.

In accordance with a yet additional exemplary embodiment of the present design a conduit for the transfer of a cooling medium is provided that includes a tube that has a length and a through aperture that extends through the entire length. The tube has an inner surface that defines a helical channel. The helical channel is continuous along a length of the tube such that the helical channel is continuous along a plurality of turns of the helical channel along the inner surface.

The cooling system and conduit, together with their particular features and benefits, will become more apparent from the following detailed description and with reference to the appended drawings.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended Figs. in which.

Figure 1:
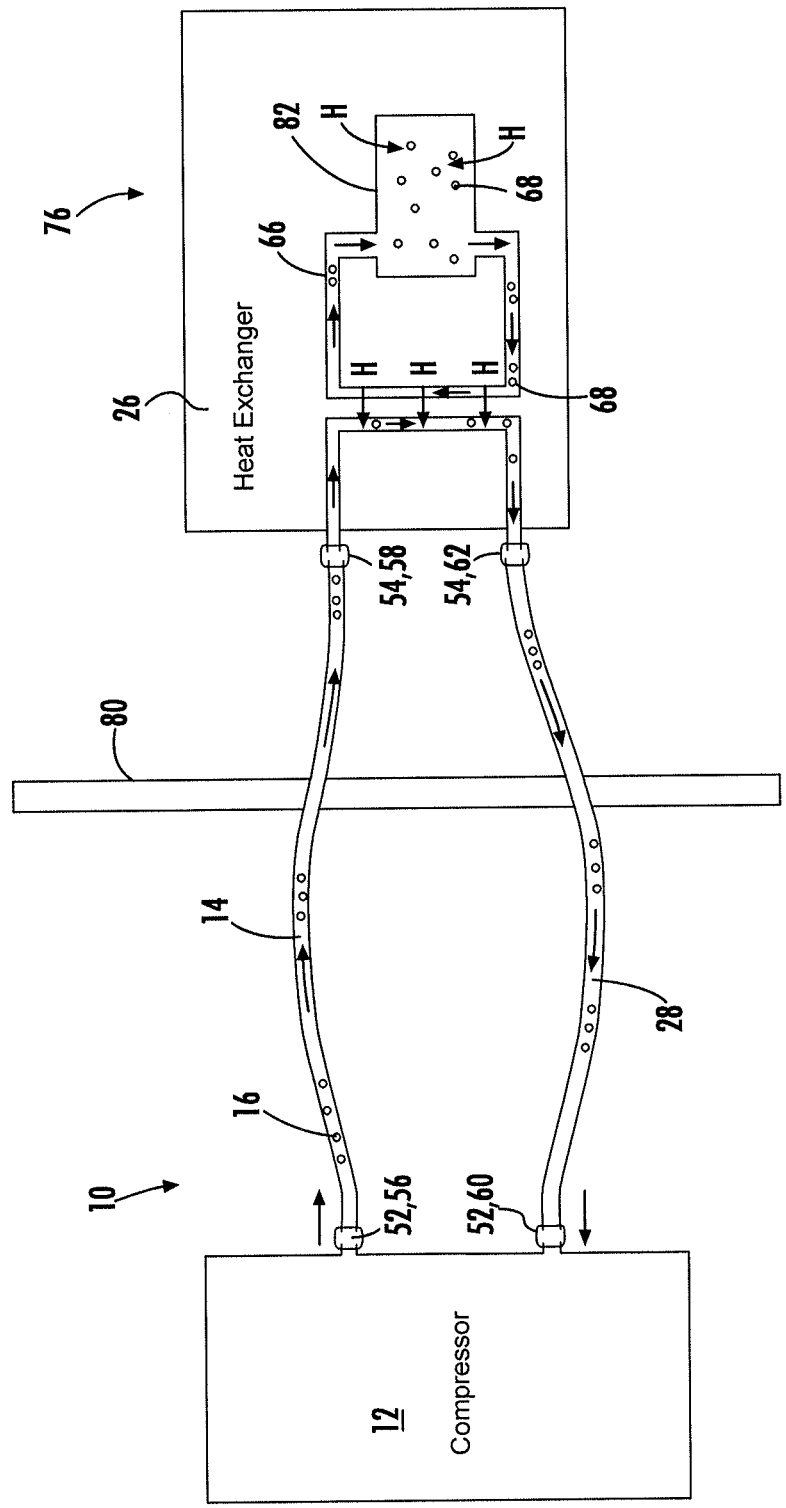
FIG. 1 is a schematic view of a cooling system for a magnetic resonance imaging device in accordance with one exemplary embodiment.

Repeat use of reference characters in the present specification and drawings is intended to represent the same or analogous features or elements of the invention.

DETAILED DESCRIPTION OF REPRESENTATIVE EMBODIMENTS

Reference will now be made in detail to embodiments of the invention, one or more examples of which are illustrated in the drawings. Each example is provided by way of explanation of the invention, and not meant as a limitation of the invention. For example, features illustrated or described as part of one embodiment can be used with another embodiment to yield still a third embodiment. It is intended that the present invention include these and other modifications and variations.

It is to be understood that the ranges mentioned herein include all ranges located within the prescribed range. As such, all ranges mentioned herein include all sub-ranges included in the mentioned ranges. For instance, a range from 100-200 also includes ranges from 110-150, 170-190, and 153-162. Further, all limits mentioned herein include all other limits included in the mentioned limits. For instance, a limit of up to 7 also includes a limit of up to 5, up to 3, and up to 4.5.

The present invention provides for a conduit 14 for the transfer of a cooling medium 16. The conduit 14 may be used in a cooling system 10 for a magnetic resonance imaging device 76 in accordance with certain exemplary embodiments. The conduit 14 includes a channel 24 on an inner surface 22 of a tube 18 that functions to reduce the amount of noise generated by the cooling system 10. The channel 24 may be helical in certain embodiments and can have a concave shape. The channel 24 may be continuous along a length of the conduit 24 such that the channel 24 is continuous from a first turn 34 to a second turn 36. In other arrangements the channel 24 may be discontinuous between successive turns 34 and 36. In yet other arrangements, there may be at least 120 turns 78 of the channel 24 per every foot of the length 44 of the tube 18. The configuration of the channel 24 allows for quieter operation of the magnetic resonance imaging device 76 and results in an improved patient experience.

One exemplary embodiment of a system 10 used in connection with a magnetic resonance imaging device 76 is shown in the schematic illustration of FIG. 1. A magnet (not shown) of the magnetic resonance imaging device 76 generates a significant amount of heat during use as it is desired to be superconductive during use and requires a cooling system 10 for heat removal. The cooling system 10 includes a compressor 12 that compresses a cooling medium 16 for the cooling cycle. The compressor 12 may operate at a pressure range from 150 psi to 310 psi in various arrangements. The cooling medium 16 may be helium in accordance with certain exemplary embodiments and may be pure helium, or helium that is 99.999% pure. However, it is to be understood that the cooling medium 16 can be a different component or components in other exemplary embodiments and may be of any degree of purity or composition. The compressor 12 is spaced from the magnetic resonance imaging device 76 because the strength of the magnet of the magnetic resonance imaging device 76 could damage components of the compressor 12. A penetration panel 80 or other structure may physically separate the compressor 12 from the magnetic resonance imaging device 76, or in other embodiments the compressor 12 may simply be positioned a safe distance from the applicable magnetic field generated by the magnetic resonance imaging device 76.

The cooling medium 16 exits the compressor 12 through a supply conduit 14 and is in a gas state. The cooling medium 16 may be in a gas state at all times through its cycle. The supply conduit 14 may be placed into fluid communication with the compressor 12 through the use of an end cap 52 that is a first supply conduit end cap 56. The supply conduit 14 may be of any length and can be flexible to achieve ease of installation and replacement. However, it is to be understood that the supply conduit 14 need not be flexible in accordance with other exemplary embodiments. An opposite end of the supply conduit 14 may be attached to a heat exchanger 26 of the magnetic resonance imaging device 76 through the use of an end cap 54 that is a second supply conduit end cap 58.

Heat H from the magnetic resonance imaging device 76 is transferred into a closed loop cooling circuit 66 that employs a second cooling medium 68 that is helium. The helium may be pure helium or the second cooling medium 68 may be 99.999% helium in certain arrangements or may be of any percentage in yet other versions of the cooling system 10. The closed loop cooling circuit 66 includes a helium vessel 82 into which helium is located. The second cooling medium 68 absorbs heat H from the magnetic resonance imaging device 76 that causes the second cooling medium 68 to evaporate from liquid helium to gaseous helium. As such, second cooling medium 68 may be in a gas state in certain portions of the closed loop cooling circuit 66, and may be in a liquid state in other portions of the closed loop cooling circuit 66. The second cooling medium 68 along with heat H absorbed from the magnetic resonance imaging device 76 can evaporate into a gas state and be transferred from the helium vessel 82 to the heat exchanger 26. This heat H is then transferred from the closed loop cooling circuit 66 to the cooling medium 16 in the heat exchanger 26. The cooling media 16 and 68 are not in fluid communication with one another but each are instead contained within their own respective closed circuits while heat is transferred from one 68 to the other 16. The cooled second cooling medium 68 is transferred back to the helium vessel 82 and may be returned to a gas state, and the heated cooling medium 16 exits the heat exchanger 26 and is returned to the compressor 12 via a return conduit 28. The cooling medium 16 may enter the heat exchanger 26 at a temperature of 75 degrees Fahrenheit and exit the heat exchanger 26 at a temperature of 85 degrees Fahrenheit in some arrangements.

The return conduit 28 can be attached to the heat exchanger 26 through the use of an end cap 54 that is a second return conduit end cap 62 to cause the return conduit 28 to be in fluid communication with the heat exchanger 26. The return conduit 28 may be flexible and of any length to again allow for ease of installation and replacement. The return conduit 28 may pass through the penetration panel 80 and placed into fluid communication with the compressor 12 through the use of an end cap 52 that is a first return conduit end cap 60. The return conduit 28 can be separate from the supply conduit 14 so that no portion of the return conduit 28 surrounds the supply conduit 14, and so that no portion of the supply conduit 14 surrounds the return conduit 28. In this regard, the supply conduit 14 is not coaxial with the return conduit 28, and these two conduits 14 and 28 do not engage one another. The conduits 14 and 28 need not be surrounded by a common braid or common insulation component. However, it is to be understood that in accordance with other exemplary embodiments that the conduits 14 and 28 may in fact be coaxial with one another, engage one another, or be surrounded by common insulation or braiding.

The cooling medium 16 is transferred through the return conduit 28 and passed into the compressor 12 where it is again compressed and transferred back out of the supply conduit 14. The cooling medium 16 may be helium in a gas state the entire time and at no point in the compressor 12, supply conduit 14, heat exchanger 26, or return conduit 28 converted into a liquid state. The cooled second cooling medium 68 may be in a gaseous state and can be transferred from the heat exchanger 26 back to the magnetic resonance imaging device 76 to provide cooling of the magnetic resonance imaging device 76. In order to introduce the cooling medium 16 to the cooling system 10, a vacuum pump may be used to draw the atmosphere out of the compressor 12 and conduits 14 and 28 at which time the cooling medium 16 can then be inserted.

Figure 2:
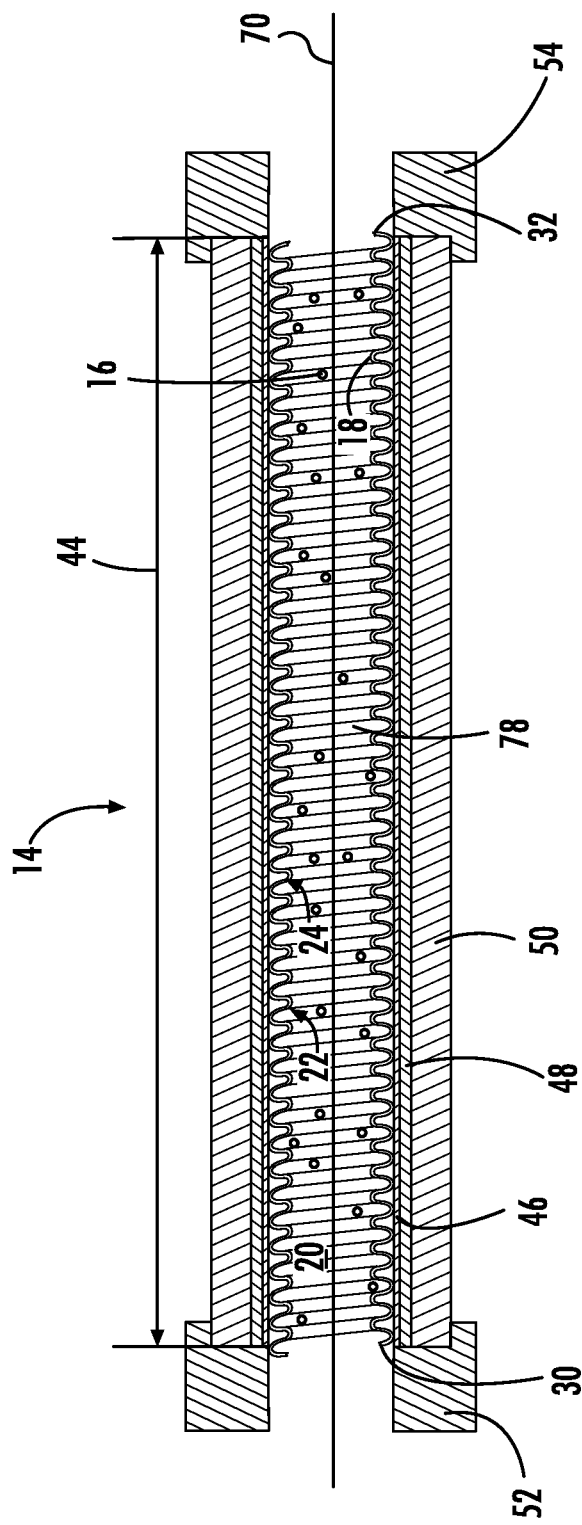
FIG. 2 is a cross-sectional view of a supply conduit with end caps attached at either end.

A conduit 14 for the transport of cooling medium 16 is shown with reference to FIG. 2. The conduit 14 includes a tube 18 that has an inner surface 22 that defines a channel 24. The tube 18 has a longitudinal axis 70 that extends through a through aperture 20 of the tube 18 when the tube 18 is configured into a linear arrangement. In accordance with one exemplary embodiment, the tube 18 is a stainless steel tube having an inner diameter of 0.750 inches, an outer diameter of 1.010 inches, and a thickness of 0.010 inches. The tube 18 has a total length 44 that extends from a first end 30 to an opposite end 32 of the tube 18. The tube 18 may be flexible in that it can bend at one or more portions along its length 44. In such instances, the longitudinal axis 70 will likewise bend at one or more portions so that the tube 18 remains coaxial about the longitudinal axis 70. Although described as being made of stainless steel, the tube 18 may be made of copper or plastic in accordance with other exemplary embodiments.

Adhesive 46 can engage an outer surface of the tube 18 and can be used to effect attachment of a braid 48 to the tube 18. The adhesive 46 extends along the entire inner surface of the braid 48 and may engage only portions of the outer surface of the tube 18 to effect this attachment. In this regard, the adhesive 46 may engage only the convex portions of the outer surface of the tube 18. In other versions of the conduit 14, the adhesive 46 is not present and the braid 48 is attached to the tube 18 without the use of this component. The braid 48 may be made of stainless steel and may function to protect the tube 18 from damage. The braid 48 can be flexible to provide this feature to the conduit 14. Further, the adhesive 46 if present can also exhibit a degree of flexibility or bend to allow or accommodate bending of the conduit 14 if such a feature is desired. The braid 48 may surround the entire outer surface of the tube 18 from the first end 30 to the second end 32. However, the end surfaces of the tube 18 at the two ends 30 and 32 may not be covered by the braid 48 as these end surfaces are not on the outer surface of the tube 18 but rather on the ends of the tube 18.

An insulation layer 50 can be located on the outer surface of the braid 48 and may surround the entire outer surface of the braid 48 from the end 30 of the tube to the opposite end 32 of the tube 18. The insulation layer 50 can be made of flexible foam in accordance with one exemplary embodiment so that this feature accommodates flexing of the conduit 14 or helps impart this feature to the conduit 14. The insulation layer 50 is the outermost portion of the conduit 14. Although not shown, adhesive may be located on the outer surface of the braid 48 to allow for attachment of the insulation layer 50 thereto. In other embodiments, the insulation layer 50 will include one or more components that exhibit tackiness to allow for attachment of the insulation layer 50 onto the outer surface of the braid 48. The insulation layer 50 functions to insulate the tube 18 and braid 48 so that heat transfer through the insulation layer 50 is minimized.

The end caps 52 and 54 can be variously arranged and function to attach the conduit 14 to other components of the cooling system 10. The end caps 52 and 54 may have threaded fittings, clamps, integral formation, mechanical fasteners, press fitting, or frictional fitting engagements to effect attachment to the conduit 14 and other components of the cooling system 10.

The tube 18 is provided with a channel 24 on its inner surface 22. The channel 24 may extend from one end 30 of the tube 18 to an opposite end 32 of the tube 18. In this regard, the channel 24 can extend along the entire length 44 of the tube 18. However, in other arrangements, the channel 24 need only extend along a portion of the length 44 and not along the entire length 44. In these arrangements, the channel 24 may be spaced some amount from the end 30 and may be spaced some amount from end 32.

Figure 3:
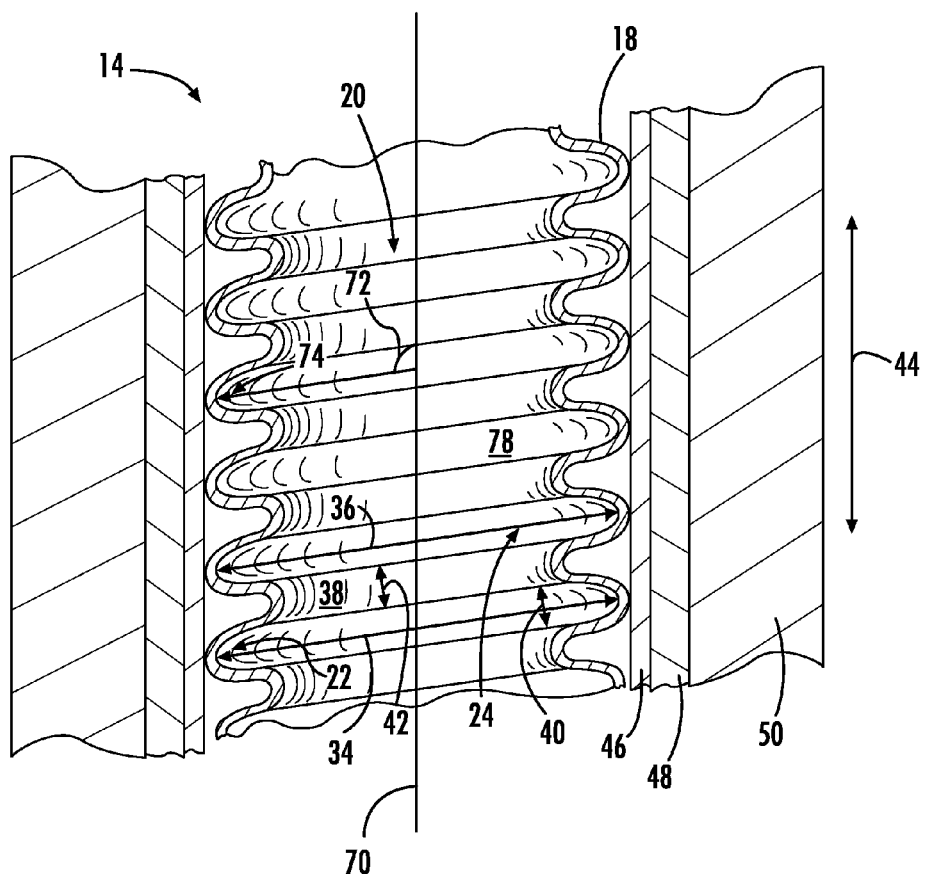
FIG. 3 is a detailed cross-sectional view of a portion of a supply conduit.

A detailed cross-sectional view of the conduit 14 is shown with reference to FIG. 3. The channel 24 is arranged in a helical configuration such that as the channel 24 extends along the inner surface 22 the channel both rotates around the longitudinal axis 70 and extends in the direction of the longitudinal axis 70, which could also be described as the length 44 direction. The channel 24 may have a concave shape. The portion of the channel 24 that is farthest from the longitudinal axis 70 is designated by reference number 74 in FIG. 3. This portion 74 may be oriented at an angle 72 to the longitudinal axis 70 that is from 91 to 95 degrees, from 95 to 100 degrees, from 100 to 115 degrees, from 115 to 125 degrees, from 125 to 135 degrees, from 135 to 155 degrees, or up to 170 degrees. The channel 24 may be arranged so that the angle 72 is the same at all portions 74 of the channel 24, or may be arranged so that the angle 72 is different at different portions 74 of the channel 24.

Figure 4:
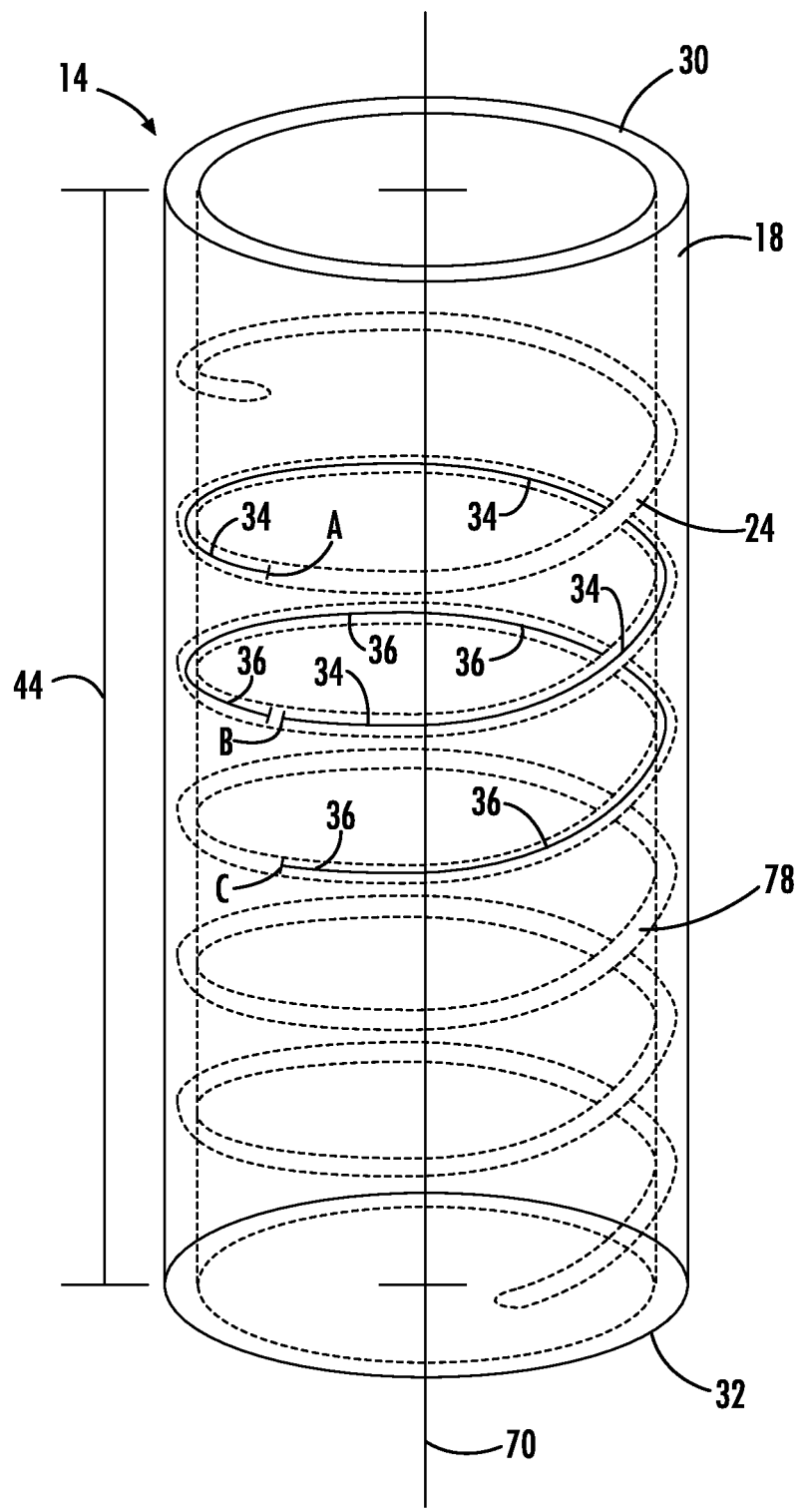
FIG. 4 is a perspective view of a tube having a continuous helical channel.

The channel 24 may be continuous from a first turn 34 of the channel 24 to a second turn 36 of the channel 24. FIG. 4 is a perspective view that better illustrates the channel 24 when arranged in a helical configuration and continuous. The channel 24 rotates a number of times about the longitudinal axis 70 from one end of the channel 24 to an opposite end of the channel 24. Each 360 degree rotation about the longitudinal axis 70 is defined as a turn 78 of the channel 24. A first turn 34 and a second turn 36 are designated for discussion purposes although it is to be understood that multiple turns 78 are made by the channel 24. The first turn 34 extends around the circumference of the tube from point "A" to point "B." Point "A" and point "B" share the same radial orientation about the longitudinal axis 70 such that they would be on top of one another if viewed from one of the ends 30 or 32. The arc length of the first turn 34 is 360 degrees from point "A" to point "B." The second turn 36 is continuous from the first turn 34 in that there is no discernible feature on the channel 24 that would indicate to a user that the channel 24 is changing from the first turn 34 to the second turn 36. The second turn 36 begins at point "B" and continues around the circumference of the tube 18 360 degrees until it reaches an arc position at point "C" that is the same as that of points "A" and "B." In this regard, if one were to view the tube 18 on one of its ends 30 or 32, the points "A", "B" and "C" would overlie one another and would be at the same arc length location with respect to the longitudinal axis 70. Additional turns 78, not labeled, extend from the second turn 36 in a similar manner. The channel 24 in FIG. 4 does not extend along the entire length 44 of the tube 18 but is spaced some distance longitudinally inwards from both of the ends 30 and 32. The channel 24 could extend along the entire length 44 in other embodiments.

With reference back to FIG. 3, the first turn 34 and the second turn 36 are again illustrated. A first convex portion 38 of the inner surface 22 separates the channel 24 of the first turn 34 from the channel of the second turn 36. In other exemplary embodiments, the portion 38 need not be convex in shape but could instead have a flat shape or be variously shaped. The channel 24 at the first turn 34 has a width 40 that extends from a lower end of the first turn 34 in the longitudinal, length 44 direction to an upper end of the first turn 34 in the longitudinal, length 44 direction. The first convex portion 38 has a width 42 that extends from a lower end of the first convex portion 38 in the longitudinal, length 44 direction to an upper end of the first convex portion 38 in the longitudinal, length 44 direction. The width 40 is greater than the width 38. However, in other exemplary embodiments, width 40 may be the same as width 38. In yet other arrangements of the tube 18, the width 40 is less than the width 42. Although not specifically identified, the channel 24 at the second turn 36 may have a width that is greater than width 42.

Additional portions that are not labeled, which may also be convex in shape, are located between successive turns 78 of the channel 24. The widths of the channel 24 at the various turns 78 may be greater than the widths of the portions that are adjacent the various turns 78. Further, the various portions that are not labeled may have a convex shape, or can be variously shaped in other exemplary embodiments. It is to be understood that the portion of the tube 18 shown in FIG. 3 is only a section of the tube 18 shown in detail for better understanding of the features of the tube 18 and that it continues upwards and downwards in the longitudinal, length 44 direction.

Figure 5:
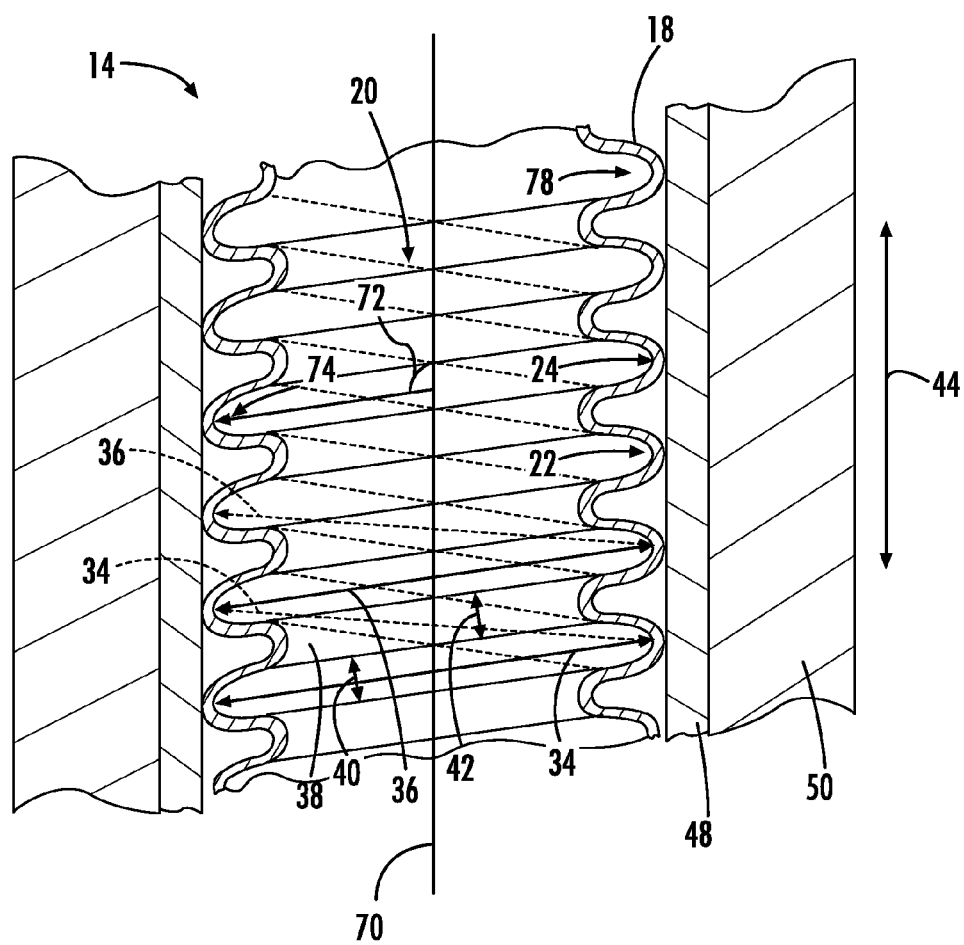
FIG. 5 is a detailed cross-sectional view of the portion of the supply conduit of FIG. 3 in which additional detail of the turns is illustrated.

FIG. 5 is a cross-section of a portion of the tube 18 that is arranged the same way as that of FIG. 3 and that shows additional details from that of FIG. 3. The first turn 34 is shown as extending both in solid lines and in dashed lines. The portion 74 of the first turn 34 that is farthest from the longitudinal axis 70 may be oriented at an angle 72 with respect to the longitudinal axis 70 along its entire length regarding both the solid lines and the dashed lines. The first turn 34 is thus more greatly illustrated in FIG. 5 than in FIG. 3. The second turn 36 extends from the dashed lined portions of the first turn 34 and is illustrated both with solid lines and with dashed lines. The entire second turn 36 has a portion 74, that is farthest from the longitudinal axis 70, that is oriented at an angle 72 to the longitudinal axis 70 that is the same as the angle 72 of the first turn 34.

Although described as being continuous, the channel 24 need not be continuous in accordance with various exemplary embodiments. In this regard, the channel 24 is discontinuous such that the first turn 34 is not continuous with the second turn 36. The first convex portion 38 is located between the first turn 34 and the second turn 36 in the longitudinal, length direction 44 such that no portion of the first turn 34 is closer to the second turn 36 than the first convex portion 38 in the longitudinal, length direction 44.

The various turns 78 may all be discontinuous from one another such that none of the successive turns 78 are continuous. However, in other arrangements, the channel 24 may be continuous between a plurality of successive turns 78, and then discontinuous between a different plurality of successive turns 78. Although described as being discontinuous, the channel 24 can still extend along the entire length 44 from one end 30 to an opposite end 32. In this regard, the channel 24 may be discontinuous between the various turns 78 but still be present at most locations between the ends 30 and 32.

Figure 6:
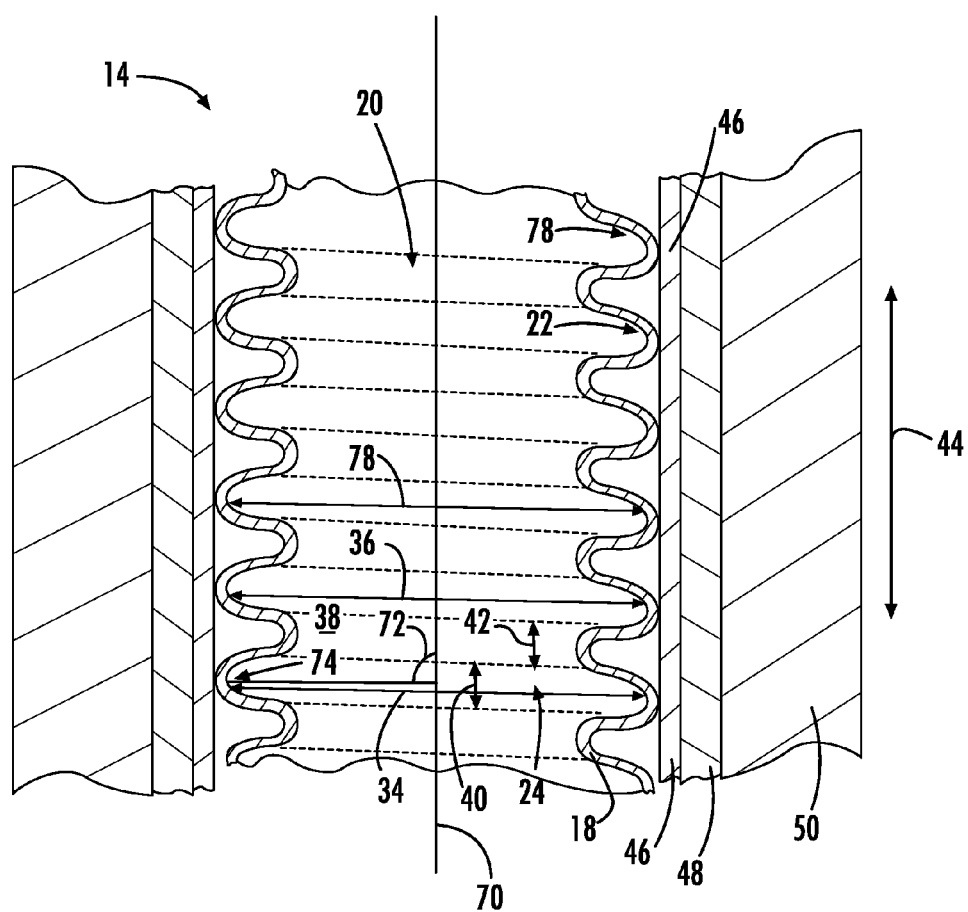
FIG. 6 is a detailed cross-sectional view of a portion of a supply conduit with turns that are discontinuous and are not helical in configuration but are circumferential.

FIG. 6 illustrates the conduit 14 as having turns 78 that are not helical in shape but are circumferential about the longitudinal axis 70. The channel 24 of the first turn 34 is concave in shape and has a portion 74 that is farthest from the longitudinal axis 70. The portion 74 is oriented at an angle 72 to the longitudinal axis 70 that is 90 degrees. The channel 24 is discontinuous between the first turn 34 and the second turn 36. The width 40 of the first turn 34 is greater than the width 42 of the first convex portion 38 that is located between the first turn 34 and the second turn 36. The channel 24 is discontinuous between the various successive turns 78, and all of the various turns of the tube 18 can be arranged in a similar manner. The other portions of the conduit 14 may be arranged in manners previously described and a repeat of this information is not necessary.

Figure 7:
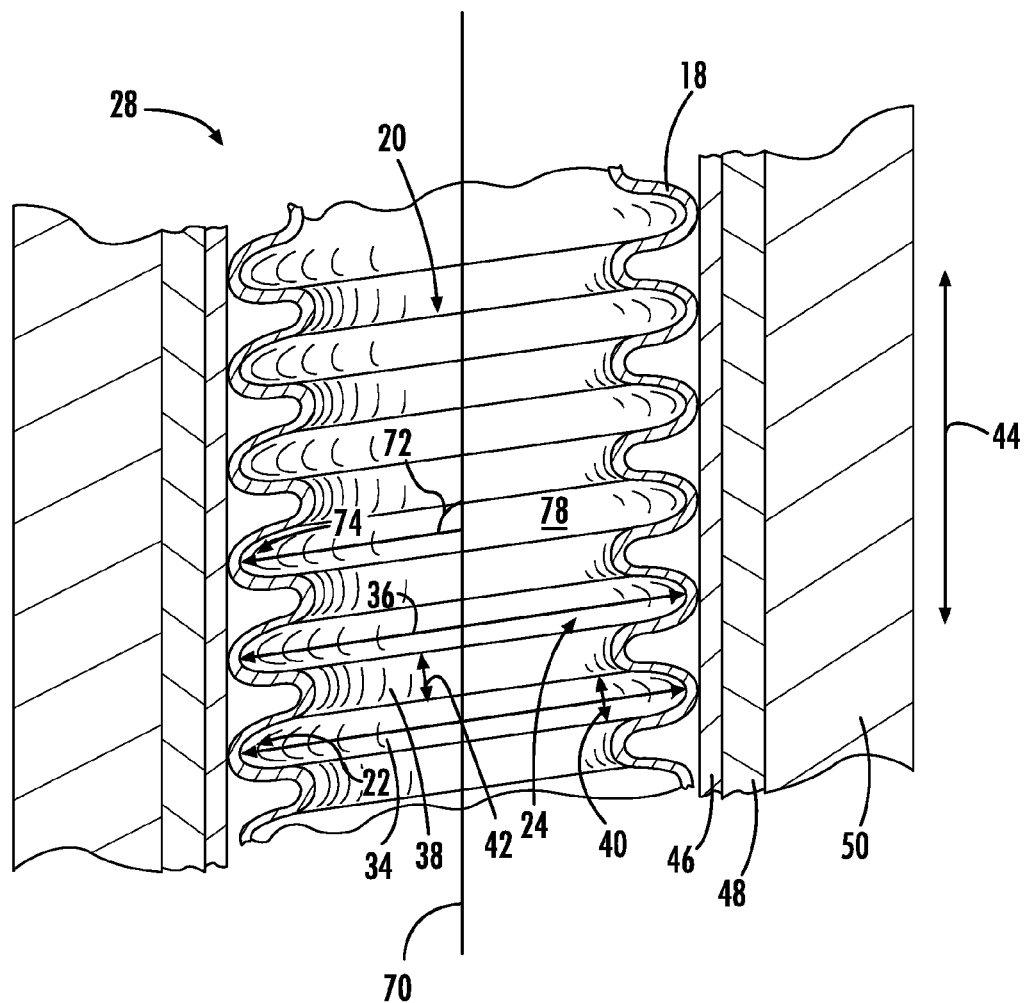
FIG. 7 is a detailed cross-sectional view of a portion of a return conduit.

FIG. 7 is a cross-sectional view of a portion of the return conduit 28. The return conduit 28 can be arranged in manners to that of the supply conduit 14 and a repeat of this information is not necessary. The return conduit 28 and supply conduit 14 of a particular cooling system 10 may be arranged in an identical manner to one another, or may have features that are different from one another in accordance with various exemplary embodiments.

The turns 78 of the channel 24 can be provided in any amount per length 44 of the tube 18. For example in accordance with certain exemplary embodiments, there may be at least 120 turns 78 per foot of length 44 of the tube 18. In yet other exemplary embodiments, there are 150 turns 78 per foot of length 44. In certain arrangements, there may be from 145-165, from 165-180, from 180-300, or up to 500 turns 78 per foot of length 44 of the tube 18. In still further exemplary embodiments, there are less than 120 turns 78 per foot of length 44 of the tube 18.

Although not wishing to be bound by any theory of operation, Applicants theorize that the configuration of channel 24 functions to reduce reverberation in the conduits 14 and/or 28 to in effect muzzle noise that may be produced either in the heat exchanger 26 or in the conduits 14, 28 or in some combination of these components. This noise reduction may produce a more quiet operation of the magnetic resonance imaging device 76 and associated cooling system 10 and provide a better patient experience, and faster and more accurate measurements. Further, although described as being used in relation to a magnetic resonance imaging device 76, the conduit 14 can be used in various applications in accordance with other exemplary embodiments.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed:

1. A cooling system for a magnetic resonance imaging device, comprising:
    a compressor;
    a supply conduit in fluid communication with the compressor, wherein a cooling medium is transferred from the compressor through the supply conduit, wherein the supply conduit has a tube that has a through aperture and an inner surface that defines a helical channel that is continuous from a first turn of the helical channel to a second turn of the helical channel, wherein the helical channel has a concave shape, wherein the inner surface has a first convex portion located between the first turn and the second turn of the helical channel, wherein a width of the helical channel of the first turn is greater than a width of the first convex portion;
    a heat exchanger that receives the cooling medium from the supply conduit and heats the cooling medium; and
    a return conduit in fluid communication with the compressor, wherein the cooling medium is transferred through the return conduit to the compressor.

2. The cooling system as set forth in claim 1, wherein the helical channel has a concave shape and is continuous from an end of the tube to an opposite end of the tube.

3. The cooling system as set forth in claim 1, wherein the tube has a length, wherein the helical channel extends along a plurality of turns that number at least 120 turns per foot of the length of the tube.

4. The cooling system as set forth in claim 1, wherein the cooling medium is helium that is in a gas state, wherein the supply conduit is flexible, and wherein the return conduit is flexible and has a tube that has a through aperture and an inner surface that defines a helical channel, wherein the supply conduit and the return conduit are separate from one another such that the supply conduit does not surround the return conduit and such that the return conduit does not surround the supply conduit.

5. The cooling system as set forth in claim 1, further comprising:
    a magnet that is included as part of the magnetic resonance imaging device; and
    a closed loop cooling circuit through which a second cooling medium that is helium is transferred, wherein the closed loop cooling circuit has a helium vessel, wherein the second cooling medium is helium that is in a liquid state in at least one point in the closed loop cooling circuit, wherein heat from the magnetic resonance imaging device is transferred to the second cooling medium and is then in turn transferred to the cooling medium in the heat exchanger.

6. A conduit for the transfer of a cooling medium, comprising:
    a tube that has a length and a through aperture that extends through the entire length, wherein the tube has an inner surface that defines a channel, wherein the channel has a plurality of turns that number at least 120 turns per foot of the length of the tube, wherein the channel has a concave shape and is discontinuous from an end of the tube to an opposite end of the tube, wherein the tube has a longitudinal axis and wherein the channel is circumferential about the longitudinal axis such that a portion of the channel farthest from the longitudinal axis is oriented at a 90 degree angle to the longitudinal axis.

7. The conduit as set forth in claim 6, wherein the channel is helical and has a concave shape.

8. The conduit as set forth in claim 7, wherein the channel is continuous from an end of the tube to an opposite end of the tube.

9. A conduit for the transfer of a cooling medium, comprising:
    a tube that has a length and a through aperture that extends through the entire length, wherein the tube has an inner surface that defines a helical channel, wherein the helical channel is continuous along a length of the tube such that the helical channel is continuous along a plurality of turns of the helical channel along the inner surface, wherein the helical channel has a concave shape and extends along a first turn and a second turn of the plurality of turns, wherein the inner surface has a first convex portion located between the first turn and the second turn of the helical channel, wherein a width of the helical channel of the first turn is greater than a width of the first convex portion.

10. The conduit as set forth in claim 9, wherein the plurality of turns of the helical channel number at least 120 turns per foot of the length of the tube.

11. The conduit as set forth in claim 9, wherein the helical channel is continuous from an end of the tube to an opposite end of the tube.

12. A cooling system for a magnetic resonance imaging device, comprising:
    a compressor;
    a supply conduit in fluid communication with the compressor, wherein a cooling medium is transferred from the compressor through the supply conduit, wherein the supply conduit has:
        (i) a tube made of stainless steel having a through aperture and an inner surface that defines a helical channel that is continuous from a first turn of the helical channel to a second turn of the helical channel,
        (ii) a stainless steel braid that surrounds the tube,
        (iii) an insulation layer made of flexible foam that surrounds the stainless steel braid;
    a heat exchanger that receives the cooling medium from the supply conduit and heats the cooling medium;
    a return conduit in fluid communication with the compressor, wherein the cooling medium is transferred through the return conduit to the compressor;
    a first supply conduit end cap attached to the supply conduit and to the compressor; and
    a second supply conduit end cap attached to the supply conduit and to the heat exchanger.

13. The cooling system as set forth in claim 12, wherein the helical channel has a concave shape and is continuous from an end of the tube to an opposite end of the tube.

14. The cooling system as set forth in claim 12, wherein the tube has a length, wherein the helical channel extends along a plurality of turns that number at least 120 turns per foot of the length of the tube.

15. The cooling system as set forth in claim 12, wherein the cooling medium is helium that is in a gas state, wherein the supply conduit is flexible, and wherein the return conduit is flexible and has a tube that has a through aperture and an inner surface that defines a helical channel, wherein the supply conduit and the return conduit are separate from one another such that the supply conduit does not surround the return conduit and such that the return conduit does not surround the supply conduit.

16. The cooling system as set forth in claim 12, further comprising:

a magnet that is included as part of the magnetic resonance imaging device; and a closed loop cooling circuit through which a second cooling medium that is helium is transferred, wherein the closed loop cooling circuit has a helium vessel, wherein the second cooling medium is helium that is in a liquid state in at least one point in the closed loop cooling circuit, wherein heat from the magnetic resonance imaging device is transferred to the second cooling medium and is then in turn transferred to the cooling medium in the heat exchanger.

17. A conduit for the transfer of a cooling medium, comprising:

a tube that has a length and a through aperture that extends through the entire length, wherein the tube has an inner surface that defines a channel, wherein the channel has a plurality of turns that number at least 120 turns per foot of the length of the tube, wherein the channel extends along a first turn and a second turn, wherein the inner surface has a first convex portion located between the first turn and the second turn of the channel, wherein a width of the channel of the first turn is greater than a width of the first convex portion.

18. The conduit as set forth in claim 17, wherein the channel is helical and has a concave shape.

19. The conduit as set forth in claim 18, wherein the channel is continuous from an end of the tube to an opposite end of the tube.

20. A conduit for the transfer of a cooling medium, comprising:

a tube that has a length and a through aperture that extends through the entire length, wherein the tube has an inner surface that defines a channel, wherein the channel has a plurality of turns that number at least 120 turns per foot of the length of the tube, a stainless steel braid that surrounds the tube; and an insulation layer made of flexible foam that surrounds the stainless steel braid;

wherein the conduit is in fluid communication with a compressor and with a heat exchanger of a magnetic resonance imaging device, wherein cooling medium that is helium that is in a gas state is present in the through aperture, wherein the tube is flexible and is made of stainless steel.

21. The conduit as set forth in claim 20, wherein the channel is helical and has a concave shape.

22. The conduit as set forth in claim 21, wherein the channel is continuous from an end of the tube to an opposite end of the tube.

23. A conduit for the transfer of a cooling medium, comprising:

a tube that has a length and a through aperture that extends through the entire length, wherein the tube has an inner surface that defines a helical channel, wherein the helical channel is continuous along a length of the tube such that the helical channel is continuous along a plurality of turns of the helical channel along the inner surface;

a stainless steel braid that surrounds the tube;

an insulation layer made of flexible foam that surrounds the stainless steel braid; and wherein the tube, the stainless steel braid, and the insulation layer are flexible such that the conduit is flexible.

24. The conduit as set forth in claim 23, wherein the plurality of turns of the helical channel number at least 120 turns per foot of the length of the tube.

25. The conduit as set forth in claim 23, wherein the helical channel is continuous from an end of the tube to an opposite end of the tube.

26. The conduit as set forth in claim 23, wherein the tube is in fluid communication with a compressor and with a heat exchanger of a magnetic resonance imaging device, wherein cooling medium that is helium that is in a gas state is present in the through aperture.

* * * * *